(12) United States Patent
Takashima et al.

(10) Patent No.: US 7,866,278 B2
(45) Date of Patent: Jan. 11, 2011

(54) THIN-FILM DEPOSITION SYSTEM

(75) Inventors: Toru Takashima, Tokyo (JP);
Yoshikazu Homma, Tokyo (JP)

(73) Assignee: JEOL Ltd., Tokyo (JP)

( * ) Notice: Subject to any disclaimer, the term of this patent is extended or adjusted under 35 U.S.C. 154(b) by 388 days.

(21) Appl. No.: 12/122,781

(22) Filed: May 19, 2008

(65) Prior Publication Data
US 2009/0090619 A1 Apr. 9, 2009

(30) Foreign Application Priority Data
Oct. 5, 2007 (JP) ............................. 2007-261786

(51) Int. Cl.
C23C 16/00 (2006.01)
C23C 14/00 (2006.01)
C25B 11/00 (2006.01)
C25B 13/00 (2006.01)

(52) U.S. Cl. .................. 118/723 HC; 118/723 DC; 118/723 AN; 118/723 EB; 118/723 VE; 118/723 CB; 204/298.06

(58) Field of Classification Search ........... 118/723 HC, 118/723 DC, 723 AN, 723 EB, 723 VE, 723 CB; 204/298.06
See application file for complete search history.

(56) References Cited

U.S. PATENT DOCUMENTS

| 4,424,104 | A | * | 1/1984 | Harper et al. ............... 427/523 |
| 4,890,575 | A | * | 1/1990 | Ito et al. ................ 118/723 HC |
| 5,380,683 | A | * | 1/1995 | Tyson et al. .................. 438/479 |
| 5,942,854 | A | * | 8/1999 | Ryoji et al. ............. 315/111.21 |
| 6,211,622 | B1 | * | 4/2001 | Ryoji et al. ............. 315/111.21 |
| 2006/0177599 | A1 | * | 8/2006 | Madocks ..................... 427/569 |

FOREIGN PATENT DOCUMENTS

| JP | 2001143894 A | 5/2001 |
| JP | 2003007240 A | 1/2003 |

OTHER PUBLICATIONS

Tohru Takashima, "Applications of High-Power Built-in Plasma Gun," JEOL News, vol. 37E, No. 1 (2002), pp. 78-80.

* cited by examiner

Primary Examiner—Michael Cleveland
Assistant Examiner—Keath T Chen
(74) Attorney, Agent, or Firm—The Webb Law Firm

(57) ABSTRACT

A thin-film deposition system has a vacuum chamber and a plasma generator. The plasma generator includes a case, a cathode disposed in the case, an anode assembly disposed at an end of the case, a discharge power supply for applying a discharge voltage between the cathode and the anode assembly, and a gas supply means for supplying a discharge gas into the case. Electrons within a first plasma produced in the case are extracted into the vacuum chamber according to the discharge voltage. An evaporated material in a gaseous state inside the vacuum chamber is irradiated with electrons emitted from the plasma generator to produce a second plasma. The potential at the anode assembly is controlled by anode potential-controlling means such that the electrons within the second plasma are directed at the plasma generator and the ions within the second plasma are directed at the substrate.

4 Claims, 3 Drawing Sheets

THIN-FILM DEPOSITION SYSTEM

BACKGROUND OF THE INVENTION

1. Field of the Invention

The present invention relates to a thin-film deposition system having a vacuum chamber containing a plasma generator.

2. Description of Related Art

A plasma generator converts gaseous molecules and evaporated particles into a high-density plasma in a thin-film deposition system, such as an ion plating system, for forming a thin film on a substrate and assisting in impinging the ions contained within the plasma onto the substrate.

FIG. 3 schematically shows one example of a thin-film deposition system incorporating a plasma generator. A crucible 3 holding an evaporable material 2 therein is mounted at the bottom of a vacuum chamber 1. An electron gun 4 for emitting an electron beam toward the evaporable material is also mounted at the bottom of the chamber 1.

A rotatable substrate dome 5 on which plural substrates are set is mounted near the top of the vacuum chamber 1. The dome is equipped with a heater 6.

A plasma generator 7 emits an electron beam to the space between the substrate dome 5 and the crucible 3.

The plasma generator 7 includes a cathode 8 made of thermionic tungsten filament or other material. The cathode 8 is connected with a heater power supply 9. An electric discharge chamber is formed inside a cylindrical case 10. The pressure inside the discharge chamber is made higher than the pressure inside the vacuum chamber 1 by argon gas introduced from a gas inlet port 11.

A first anode 12 is water-cooled and connected with a discharge power supply 13 via a resistor R1 having resistance R1. A second anode 14 is mounted to cover the surface of the first anode. A part of the first anode 12 is connected to a part of the second anode 14 to increase the thermal resistivity between them.

A shield body 15 is held to the case 10. An orifice permitting passage of the electron beam is formed at the front end of the shield body 15. A coil 16 consists of an electromagnet for producing a magnetic field parallel to the direction in which electrons are extracted. A plasma 17 created in the case 10 is focused toward the center axis of the case by the coil 16.

The cathode 8, first anode 12, second anode 14, case 10, resistor R1, heater power supply 9, and discharge power supply 13 together form a discharge circuit, which in turn is connected with the vacuum chamber 1 via a resistor R2 having resistance R2.

In the plasma generator 7, a given amount of argon gas is first introduced into the case 10 from the gas inlet port 11 to increase the pressure inside the case. The cathode 8 is heated to a temperature at which thermionic emission is possible by the heater power supply 9. Then, the coil 16 is energized with a given electrical current to induce plasma ignition and produce a magnetic field necessary to obtain a stable plasma.

Under this condition, if a given voltage, for example, of 100 V is applied between the cathode 8 and the anode assembly (12, 14) from the discharge power supply 13, an electric field 18 is produced over the orifice formed in the shield body 15. Thermoelectrons emitted from the cathode 8 are started to be accelerated toward the anode assembly (12, 14) by the electric field. The acceleration of the thermoelectrons causes repeated collisions of the thermoelectrons with the introduced argon gas, producing the plasma 17 inside the case 10.

The electrons produced inside the plasma 17 in this way are drawn into the vacuum chamber 1 by the electric field 18 while focused toward the center axis of the case by the magnetic field produced by the coil 16.

On the other hand, inside the vacuum chamber 1, an electron beam 19 from the electron gun 4 is directed at the evaporable material 2. The material is heated and evaporated. A process gas (e.g., oxygen gas) is introduced into the vacuum chamber 1 from a process gas inlet port 20.

The electrons extracted into the vacuum chamber 1 are made to collide against the process gas and particles of the evaporated material inside the vacuum chamber. The gas and particles are excited and ionized. Consequently, a plasma 22 is produced inside the vacuum chamber. The evaporated particles ionized within the plasma are drawn to the substrate set on the substrate dome 5 and adhered to the substrate. A film of the particles of the evaporated material is formed on the substrate.

The electrons extracted into the vacuum chamber 1 and the electrons within the plasma 22 flow into the wall of the vacuum chamber 1 and into the anodes 12, 14, maintaining a stable electric discharge.

Where an optical thin film is formed by the thin-film deposition system designed as described above, particles of evaporated, non-conductive dielectric materials that form the optical thin film adhere to the inner wall of the vacuum chamber 1, increasing the impedance. Therefore, most of the electrons extracted into the vacuum chamber 1 and the electrons within the plasma 22 are forced toward the anodes 12 and 14 by establishing the relationship R1<R2, where R1 and R2 are the resistances of the resistors R1 and R2 of the plasma generator 7.

The process by which a film is formed on the substrate is next described in somewhat further detail. The plasma 22 created in the vacuum chamber 1 by the plasma generator 7 gives energy to the particles evaporated from the evaporable material 2 and the oxygen gas from the process gas inlet port 20. Some of them are excited and ionized. As a result, the high-density plasma 22 is created inside the vacuum chamber 1. Furthermore, electrons are accumulated on the surface of the substrate dome 5 exposed to the plasma 22. A negative voltage is applied to the surface of the substrate dome.

Meanwhile, the plasma 22 has a zero or positive potential and so there is a difference in potential between the plasma 22 and the substrate dome 5 near the surface of the dome 5. The ions within the plasma 22 near the substrate dome are accelerated toward the substrate, thus bombarding it.

The bombardment is combined with the excitation and ionization of the evaporated particles and process gas to permit the quality of the film formed on the substrate to be improved. That is, the packing density of the film is enhanced, and the adhesion is improved.

Where an optical thin film is formed by a thin-film deposition system, the film is strongly required to have optical characteristics which do not change with environmental variations. For this purpose, it is important to enhance the packing density of the film. In the above-described thin-film deposition system, bombardment of ions present close to the substrate dome 5 against the substrate greatly contributes to the packing density.

Accordingly, in the aforementioned thin-film deposition system, the difference between the negative potential at the substrate dome 5 and the positive potential possessed by the plasma 22 is increased by increasing the density of the plasma 22. This increases the energy with which the ions present close to the dome 5 are accelerated toward the substrate. As a result, the packing density of the film can be enhanced. An optical thin film having improved environmental resistance can be formed.

However, if the density of the plasma 22 within the vacuum chamber 1 is enhanced, the temperature of the substrate dome 5 exposed to the plasma is elevated greatly with the elapse of time. There is the danger that the maximum processing temperature of the substrate will be exceeded.

If coating is done at a temperature lower than the maximum processing temperature of the substrate by lowering the density of the plasma 22, ions accelerated toward the substrate have lower energies, and the packing density of the film is not enhanced. There is the problem that the quality of the film is deteriorated.

It is desirable to be capable of modifying the energy of the ions bombarded against the substrate at will according to the kind of the evaporable material. In the present system, however, it is impossible to control the density of the plasma 22 within the vacuum chamber and the energy of the ions accelerated toward the substrate independently. Hence, it is not possible to finely establish the conditions under which thin films are formed.

SUMMARY OF THE INVENTION

It is an object of the present invention to provide a novel thin-film deposition system capable of solving the foregoing problems.

A thin-film deposition system according to one embodiment of the present invention includes a vacuum chamber and a plasma generator. The plasma generator has: a discharge chamber; a cathode disposed in the discharge chamber; an anode assembly disposed at an end of the discharge chamber; a cylindrical shield body mounted in the discharge chamber and surrounding at least the anode assembly out of the anode assembly and the cathode; a first power supply for applying a discharge voltage between the cathode and the anode assembly; and a port for supplying a discharge gas into the discharge chamber. Electrons within a first plasma produced in the discharge chamber are extracted into the vacuum chamber through a part of the shield body according to the discharge voltage, the vacuum chamber being located outside the discharge chamber. An evaporable material that is at least in a gaseous state within the vacuum chamber is irradiated with electrons emitted from the plasma generator to produce a second plasma, thus forming a film on the substrate. The potential at the anode assembly is so controlled by an anode potential controller that the electrons within the second plasma are directed toward the plasma generator, whereby ions within the second plasma are directed at the substrate.

According to the present invention, increases in temperature of the substrate are suppressed by using a low-density plasma. The substrate can be irradiated with an arbitrary energy beam created by ions within the low-density plasma. The packing density of a thin film formed under low-temperature process environments can be enhanced. A high-quality thin film can be built.

Furthermore, generation of the plasma within the vacuum chamber and the energy with which the ions within the plasma are bombarded against the substrate can be controlled independently. Therefore, an ion beam having an optimum energy can be bombarded against the substrate according to the kind of the evaporable material. As a result, conditions under which each evaporable material is vapor-deposited can be set finely.

These and other objects and advantages of the present invention will become more apparent as the following description proceeds.

DESCRIPTION OF THE PREFERRED EMBODIMENTS

The preferred embodiment of the present invention is hereinafter described in detail with reference to the drawings.

Figure 1:
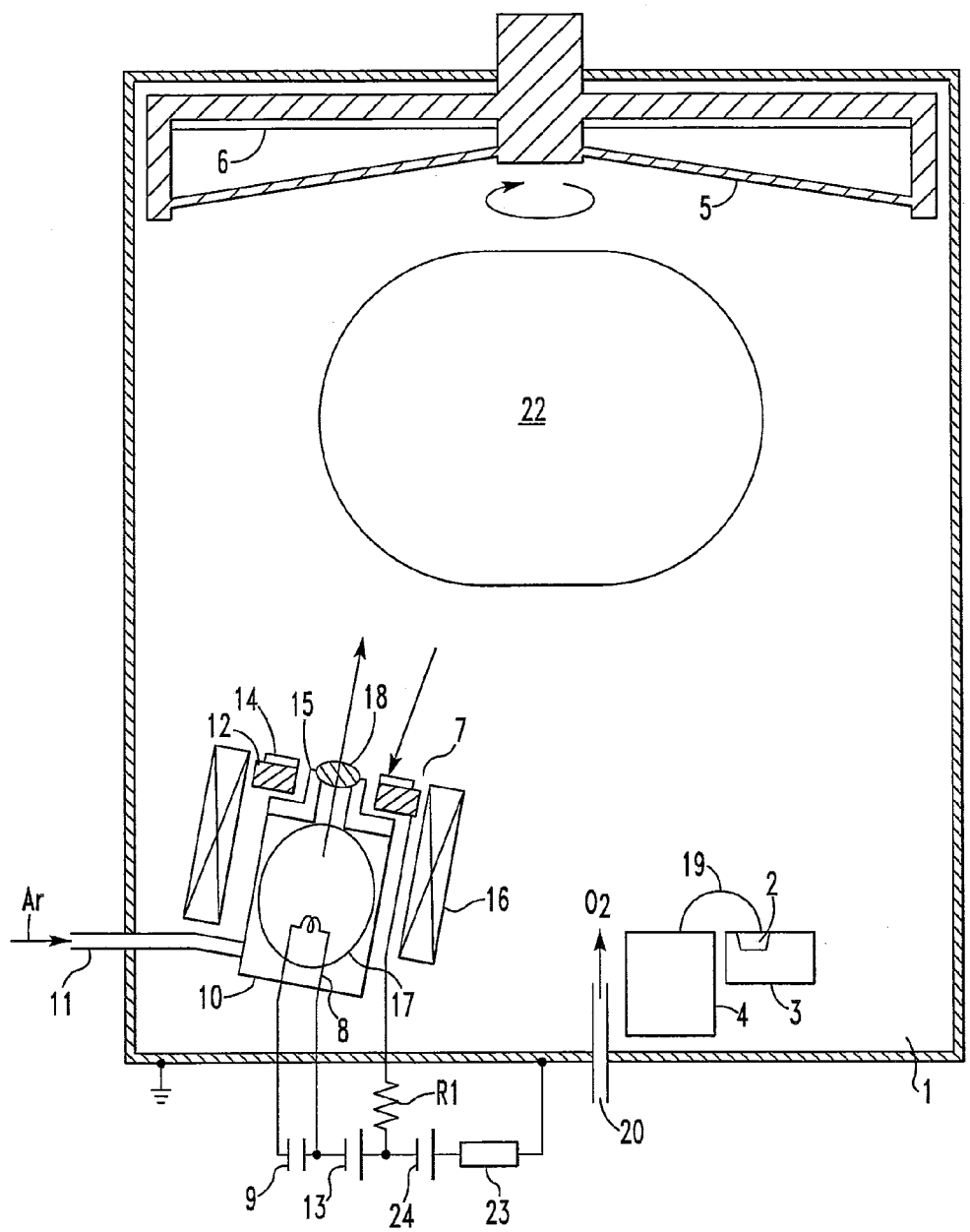
FIG. 1 is a schematic representation of a thin-film deposition system according to one embodiment of the present invention, the system incorporating a plasma generator.

FIG. 1 is a schematic representation of a thin-film deposition system according to one embodiment of the present invention. In both FIGS. 1 and 3, like components are indicated by like reference numerals.

Figure 3:
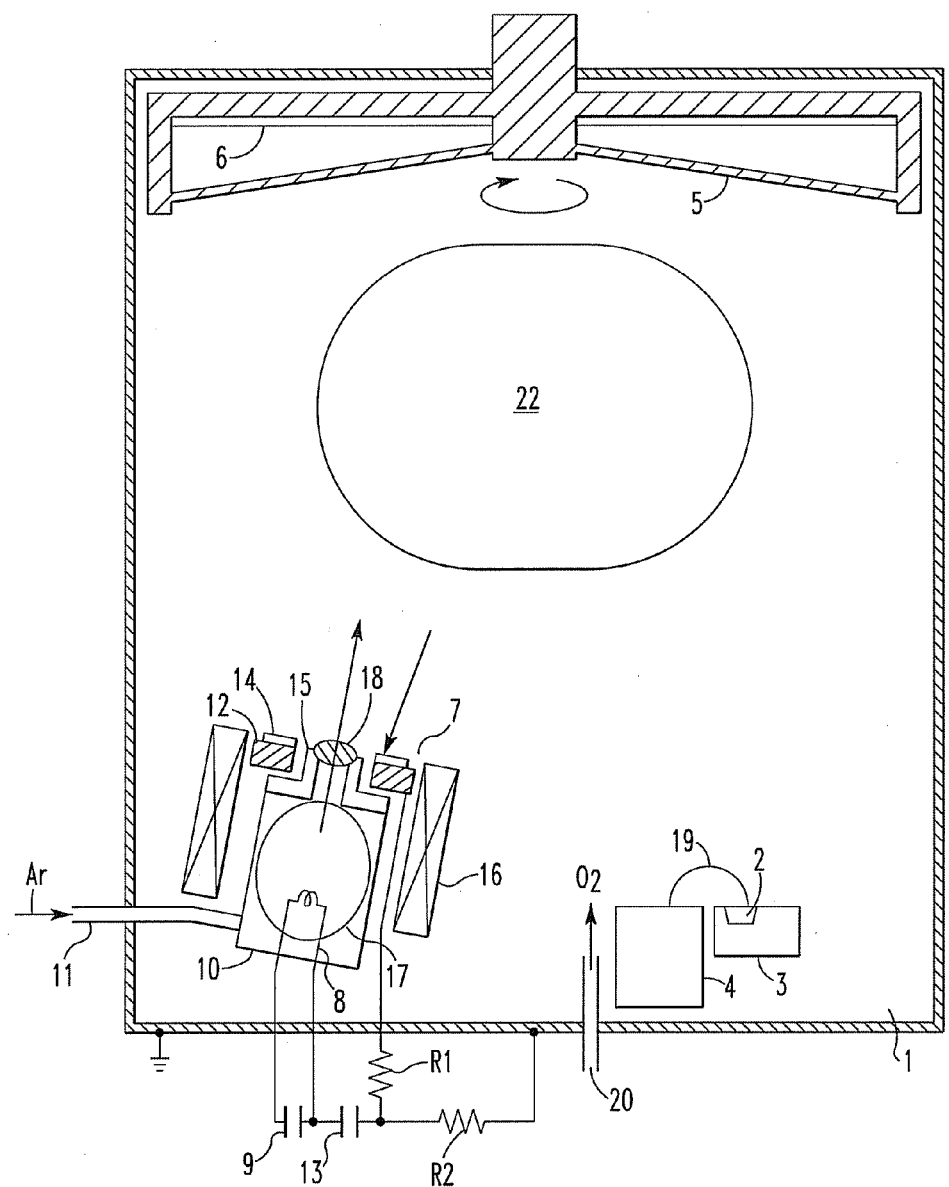
FIG. 3 is a schematic representation of a prior art thin-film deposition system incorporating a plasma generator.

The system shown in FIG. 1 is similar to the system already described in connection with FIG. 3 except that the discharge circuit composed of the cathode 8, first anode 12, second anode 14, case 10, resistor R1, heater power supply 9, and discharge power supply 13 is connected with the vacuum chamber 1 via an impedance-adjusting circuit 23 and an auxiliary power supply 24. The chamber 1 is at ground potential. The system constructed in this way operates as follows.

First, a given amount of argon gas is introduced into the case 10 from the gas inlet port 11 to increase the pressure inside the case. The cathode 8 is heated to a temperature where thermionic emission is possible by the heater power supply 9.

Then, the coil 16 is energized with a given electrical current to induce plasma ignition and produce a magnetic field necessary to obtain a stable plasma.

Under this condition, if a given voltage, for example, of 100 V is applied between the cathode 8 and the anode assembly (12, 14) from the discharge power supply 13, an electric field 18 is produced over an orifice formed in the shield body 15. Thermoelectrons emitted from the cathode 8 are started to be accelerated toward the anodes 12 and 14 by the electric field. The acceleration of the thermoelectrons causes repeated collisions of the thermoelectrons with the introduced argon gas, producing the plasma 17 inside the case 10.

The electrons produced inside the plasma 17 in this way are drawn into the vacuum chamber 1 by the electric field 18 while focused toward the center axis of the case 10 by the magnetic field produced by the coil 16.

Inside the vacuum chamber 1, the electron beam. 19 from the electron gun 4 is directed at the evaporable material 2. The material is heated and evaporated. A process gas (e.g., oxygen gas) is introduced into the vacuum chamber from a process gas inlet port 20.

The electrons extracted into the vacuum chamber 1 are made to collide against the process gas and particles of the evaporated material inside the vacuum chamber. The gas and particles are excited and ionized. Consequently, a plasma 22 is produced inside the vacuum chamber. The evaporated particles ionized within the plasma are drawn to the substrate set on the substrate dome 5 and adhered to the substrate. A film of the particles of the evaporated material is formed on the substrate.

The electrons extracted into the vacuum chamber 1 and the electrons within the plasma 22 flow into the wall of the vacuum chamber 1 and into the anodes 12, 14, maintaining a stable electric discharge. The features of the present invention are described below.

Under environments of a low-temperature process (e.g., below 150° C.), the thin-film deposition system according to the present invention is utilized in the manner described below.

First, the output of the plasma 22 is set low. In this embodiment, the discharge current is set to about 10 A by controlling the discharge power supply 13. At this current, increases in the substrate temperature are not affected. The discharge voltage is merely required to produce the discharge current. Normally, the discharge current is set to an arbitrary value within the range from about 70 V to 140 V depending on the pressure condition, because the discharge current is used under constant-current control.

Under this condition, the plasma 22 created inside the vacuum chamber 1 has a low density causing less increase in the temperature of the substrate. In this state, ions present near the substrate dome 5 are accelerated toward the substrate with low energy, and it is impossible to enhance the packing density of the formed film as described previously.

Accordingly, the impedance-adjusting circuit 23 introduced by the present invention limits the electron current I flowing from the grounded portion (vacuum chamber 1) into the discharge power supply 13. This makes it possible to produce any arbitrary resistance R (e.g., 20 to 600Ω) for enhancing the potential at the anode assembly (12, 14). As a result, a self-biasing voltage (I×R) produced by the impedance-adjusting circuit 23 makes the potential at the anode assembly have a positive potential with respect to the potential at the grounded portion (vacuum chamber 1) c, as indicated by b in FIG. 2.

Figure 2:
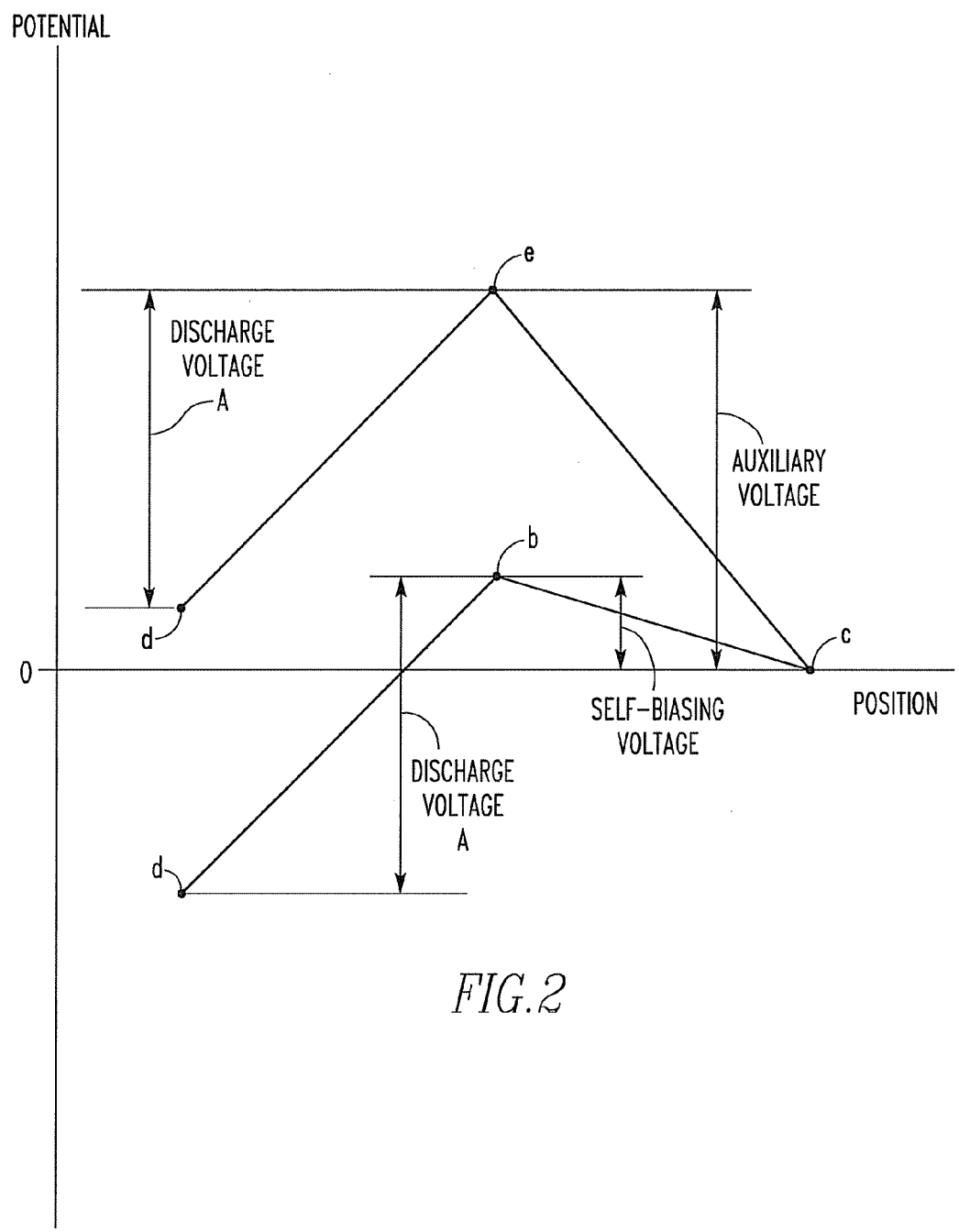
FIG. 2 is a graph illustrating potentials at various locations within the system shown in FIG. 1.

FIG. 2 is a graph showing the potentials at various locations within the system shown in FIG. 1. In the graph, the vertical axis indicates potential, while the horizontal axis indicates position (i.e., distance). The potential at the cathode 8 is indicated by a. Although the bias voltage (I×R1) produced by the resistor R1 affects the potential at the anode assembly (12, 14), the bias voltage generated by the resistor R1 is prevented from becoming high by setting the value of R1 to less than 10Ω. In FIG. 2, discharge voltage A is produced between the anode assembly (12, 14) of the plasma generator 7 and the cathode 8.

The auxiliary power supply 24 produces a voltage that further enhances the anode potential as indicated by e in FIG. 2 (at that time, the potential at the cathode 8 is indicated by d). As a result, the potential difference (auxiliary voltage) between the anode potential indicated by e and the potential at the grounded portion (indicated by c) increases as shown in FIG. 2. Electrons within the plasma 22 are accelerated by the anodes 12 and 14 and, at the same time, the ions within the plasma 22 are accelerated in the direction reverse to the motion of the electrons. Thus, the ions move toward the substrate. When the current flowing into the grounded vacuum chamber 1 is switched from current based on electrons (electron current) to current based on ions (ion current), the generated resistance R is controlled to zero by the impedance-adjusting circuit 23. Under this condition, no limitations are imposed on the ion current flowing through the impedance-adjusting circuit 23.

In this way, the plasma 22 having an arbitrary density is created by controlling the discharge power supply 13. Apart from this, the auxiliary power supply 24 is controlled to accelerate the ions within the plasma 22 at will. An ion energy corresponding to the voltage generated by the auxiliary power supply can be given to the substrate. Accordingly, a low-density plasma can be created. The substrate can be bombarded with a strong energy beam produced from the ions within the low-density plasma. Consequently, in formation of a thin film, the packing density of the film can be enhanced.

The discharge power supply 13 that is a power supply for creating the plasma 22 in the vacuum chamber 1 cooperates with the auxiliary power supply 24 for accelerating electrons within the plasma 22 toward the anode assembly (12, 14) to enable independent control over generation of the plasma 22 and the energy of ions contained within the plasma and bombarding the substrate. In consequence, an ion energy beam that is optimal for the kind of the evaporable material can be emitted. Hence, evaporation conditions can be finely set for various evaporable materials.

Having thus described our invention with the detail and particularity required by the Patent Laws, what is desired protected by Letters Patent is set forth in the following claims.

The invention claimed is:

1. A thin-film deposition system comprising:
   a vacuum chamber; and
   a plasma generator including a discharge chamber, a cathode disposed in the discharge chamber, an anode assembly disposed at an end of the discharge chamber, a first power supply for applying a discharge voltage between the cathode and the anode assembly, and means for supplying a discharge gas into the discharge chamber,
   wherein electrons within a first plasma produced in the discharge chamber are extracted into the vacuum chamber through the aperture of the anode assembly according to the discharge voltage, the vacuum chamber being located outside the discharge chamber,
   wherein an evaporable material that is at least in a gaseous state within the vacuum chamber is irradiated with electrons emitted from the plasma generator to produce a second plasma, thus forming a film on a substrate, and
   wherein there is further provided anode potential-controlling means for controlling the potential at the anode assembly such that the electrons within the second plasma are directed toward the plasma generator, whereby ions within the second plasma are directed at the substrate.

2. A thin-film deposition system as set forth in claim 1, wherein said anode potential-controlling means is capable of controlling energy of the ions bombarded against the substrate.

3. A thin-film deposition system as set forth in claim 1, wherein said anode potential-controlling means maintains the potential at the anode assembly at a positive value with respect to ground potential at all times.

4. A thin-film deposition system as set forth in claim 1, wherein
   (A) said anode potential-controlling means is formed by connecting an impedance-adjusting circuit and an auxiliary power supply in series between the anode assembly and a grounded point,
   (B) a positive bias is applied to the anode assembly at all times,
   (C) when an electron current flows into the grounded point, the impedance-adjusting circuit produces a given impedance to make an adjustment for limiting the electron current, and
   (D) when an ion current flows into the grounded point, the impedance is made zero and the ion current is permitted to flow.

* * * * *